United States Patent
Lee et al.

(10) Patent No.: US 8,345,472 B2
(45) Date of Patent: Jan. 1, 2013

(54) THREE-TERMINAL OVONIC THRESHOLD SWITCH AS A CURRENT DRIVER IN A PHASE CHANGE MEMORY

(75) Inventors: Jong-Won Lee, San Francisco, CA (US); Gianpaolo Spadini, Scotts Valley, CA (US)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 12/974,424

(22) Filed: Dec. 21, 2010

(65) Prior Publication Data

US 2012/0155161 A1    Jun. 21, 2012

(51) Int. Cl.
*G11C 11/00* (2006.01)

(52) U.S. Cl. .............. 365/163; 365/151; 365/189.08; 365/189.16; 365/185.24

(58) Field of Classification Search .......... 365/163, 365/151, 189.08, 189.16, 185.24
See application file for complete search history.

(56) References Cited

U.S. PATENT DOCUMENTS

| | | | |
|---|---|---|---|
| 6,967,344 B2 | 11/2005 | Ovshinsky et al. | |
| 6,969,867 B2 | 11/2005 | Ovshinsky | |
| 7,186,998 B2 | 3/2007 | Ovshinsky et al. | |
| 7,308,067 B2 * | 12/2007 | Lowrey et al. | 365/185.24 |
| 7,313,016 B2 * | 12/2007 | Dodge et al. | 365/163 |
| 7,466,584 B1 * | 12/2008 | Parkinson et al. | 365/163 |
| 7,547,906 B2 | 6/2009 | Ovshinsky | |
| 7,692,958 B2 * | 4/2010 | Parkinson | 365/163 |
| 7,778,064 B2 * | 8/2010 | Parkinson et al. | 365/148 |
| 7,864,567 B2 * | 1/2011 | Gordon et al. | 365/163 |
| 7,920,414 B2 * | 4/2011 | Lowrey | 365/163 |
| 7,957,207 B2 * | 6/2011 | Parkinson | 365/189.15 |
| 7,961,495 B2 * | 6/2011 | Parkinson | 365/148 |
| 7,990,761 B2 * | 8/2011 | Gordon et al. | 365/163 |
| 8,031,516 B2 * | 10/2011 | Tang | 365/163 |
| 8,120,940 B2 * | 2/2012 | Wicker | 365/148 |
| 8,194,433 B2 * | 6/2012 | Parkinson | 365/148 |

OTHER PUBLICATIONS

Ovshinsky, Stanford, "New Transformative Possibilities for Ovonic Devices," European\Phase Change and Ovonics Symposium 2010, Sep. 6, 2010, Milan, Italy, http://www.epcos.org/library/papers/pdf_2010/NewTransformativePossibilitiesOvonicDevices.pdf, Retrieved Oct. 26, 2010.

* cited by examiner

*Primary Examiner* — Viet Q Nguyen
(74) *Attorney, Agent, or Firm* — Cool Patent, P.C.; Bruce A. Young

(57) ABSTRACT

A three-terminal Ovonic Threshold Switch (OTS) is used to provide current to a Phase Change Memory Switch (PCMS) cross point array. The current is started by sending a small current into the second terminal of the three-terminal OTS allowing a larger current to flow from the first terminal to the third terminal of the three-terminal OTS. A method of making the three-terminal OTS is also presented.

12 Claims, 8 Drawing Sheets

THREE-TERMINAL OVONIC THRESHOLD SWITCH AS A CURRENT DRIVER IN A PHASE CHANGE MEMORY

TECHNICAL FIELD

The present subject matter relates generally a field of electronics including semiconductor memory devices. More specifically, the present subject matter relates to phase change memory devices and methods of making same.

BACKGROUND

Memory for computers or other electronic devices can include blocks of memory cells integrated into a larger integrated circuit or stand-alone integrated circuits. There are many different types of memory including random-access memory (RAM), read only memory (ROM), dynamic random access memory (DRAM), static RAM (SRAM), synchronous dynamic RAM (SDRAM), flash memory and phase change memory. Phase change memory devices utilize materials that have different electrical properties in their crystalline and amorphous phases. Each phase change memory cell may be programmed by putting the material in the memory cell into either a crystalline phase or an amorphous phase providing non-volatile memory that does not require power to retain its contents. Phase change memories are often programmed using heat generated by an electrical current to control the state of the phase change material.

Phase change memory cells may be made from chalcogenide materials. Chalcogenide materials include at least one element from Group VI A of the periodic table. Chalcogenide phase change material, when heated to a temperature above its melting point and allowed to cool quickly, will remain in an amorphous glass-like state with a high electrical resistance. The chalcogenide phase change material, when heated to a temperature above its glass transition temperature $T_g$ but below the melting point, will transform into a crystalline phase with a much lower resistance. This difference in the material properties between the amorphous and crystalline phases of chalcogenide materials may be used to create a phase change memory device.

In a phase change memory device, a high peak current is involved to program a phase change memory switch (PCMS) cross-point array. Either the driver devices should have a high current density so they can be built at the same pitch as the memory array via simple metal wire routing, or the driver devices otherwise should be large enough to provide sufficient current, in which case they are not the same pitch as the memory array and are placed off to the side which complicates metal wire routing, or the pitch of the array is relaxed to accommodate the larger driver devices.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. They should not, however, be taken to limit the invention to the specific embodiment(s) described, but are for explanation and understanding only. Such subject matter may be understood by reference to the following detailed description when read with the accompanying drawings in which.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this invention. These descriptive terms and phrases are used to convey a generally agreed upon meaning to those skilled in the art unless a different definition is given in this specification. Reference now is made in detail to the examples illustrated in the accompanying drawings and discussed below.

Figure 1A:
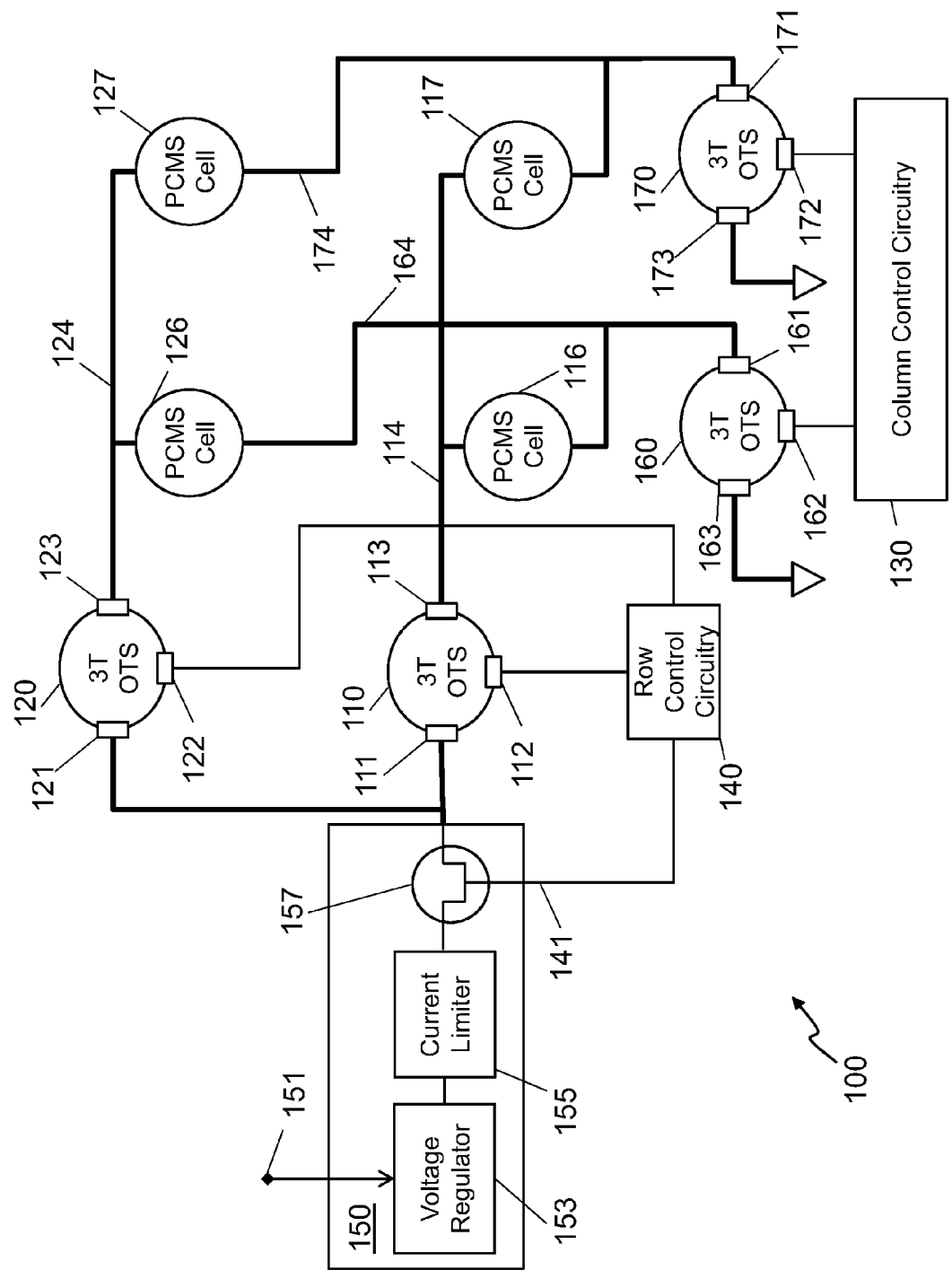
FIG. 1A shows a block diagram of an embodiment of using a three-terminal Ovonic Threshold Switch (OTS) as a current driver for a phase change memory cell with switch (PCMS)

FIG. 1A shows a block diagram of an embodiment of a circuit 100 utilizing three-terminal Ovonic Threshold Switches (OTS) 110, 120, 160, 170 as current drivers for programming phase change memory cells with switch (PCMS) 116, 117, 126, 127. A three-terminal OTS is a piece of glassy material with high-resistance state and a conductive state, such as a glassy chalcogenide material, with 3 separate terminals (or electrodes). In general, a glassy material is an amorphous solid material that exhibits a glass transition from a hard state to a vitreous molten state when heated towards a liquid phase. A glassy chalcogenide, or chalcogenide glass, is a glass material that includes one or more chalcogenide elements. Such chalcogenide elements are in Group 16 in the periodic table, for example sulfur, selenium, or tellurium, from which a glass chalcogenide may be formed. Cross-sections of various embodiments of a three-terminal OTS are shown in FIGS. 7E, 7F, 8A, 8B, 9E, and 9F, which will be discussed in more detail later herein, and FIG. 8B will be used as an example embodiment for the present discussion. A three-terminal OTS may have a threshold voltage $V_T$ there across, between terminals one 841 and three 843 and may be referred to as $V_{T13}$, that may be varied by the amount of current flowing into the control terminal 842 (terminal two). As long as the voltage across the three-terminal OTS remains below $V_T$, only a leakage current based on the resistance of the three-terminal OTS in the high-resistance state flows through the three-terminal OTS. When the voltage across the three-terminal OTS exceeds $V_T$, the three-terminal OTS enters the conductive state allow high levels of current to flow through the three-terminal OTS. The three-terminal OTS may behave as a current amplifier by using a small control current flowing in into the control terminal 842 to change $V_T$ from a level above the voltage applied to the three-terminal OTS to level below the voltage applied causing a large current to flow through the three-terminal OTS.

The device operation described above can be used to drive electrical current to program a phase change memory (PCM) cell. A transistor with small electrical current capacity may send current into the control terminal of the three-terminal OTS, causing $V_T$, to drop, and, if an appropriate voltage has been applied to the three-terminal OTS, trigger current to flow through the three-terminal OTS. Because a three-terminal OTS may be able to sustain a high current density, on the same order or higher than the PCM cell, and the three-terminal OTS may be configured to supply the current to PCM, the other circuitry around the PCM and three-terminal OTS does not need to be able to sustain a high current, and thus can be packed into a relatively smaller space.

Circuit 100 includes a 2×2 array of PCMS cells 116, 117, 126, 127, which may be a part of a larger array, with PCMS cell 126 and PCMS cell 127 connected to word line (or row line) 124 and PCMS cell 116 and PCMS cell 117 connected to word line (or row line) 114. PCMS cell 116 and PCMS 126 are connected to bit line (or column line) 164 and PCMS cell 117 and PCMS cell 127 are connected to bit line (or column line) 174 so that each PCMS cell may be connected to a unique combination of word line and bit line. Current flowing from a bit line to a word line may flow through a PCMS cell. A PCM cell may comprise several elements including a volume of phase change material with electrical contacts on opposite sides of the phase change material, a heater element in close proximity to the phase change material, and an access device such as a diode, transistor or OTS, although some embodiments may not have a heater and/or access device. As described and used herein, a PCM cell may or may not include a switch or other access device and a PCMS cell may be thought of as one type of a PCM cell. In some embodiments, current flowing through the PCM cell may only flow through the heater element to cause the heater to heat the phase change material. In other embodiments, current flowing through the PCM cell may also flow through the phase change material and/or the access device, depending on the embodiment.

In the embodiment shown in FIG. 1A, word line 114 is connected to the third terminal 113 of three-terminal OTS 110 and word line 124 is connected to the third terminal 123 of three-terminal OTS 120 with bit line 164 connected to the first terminal of three-terminal OTS 160 and bit line 174 connected to the first terminal 171 of three-terminal OTS 170. The first terminal 121 of three-terminal OTS 120 and the first terminal 111 of three terminal OTS 110 are connected to the output of power supply circuitry 150. The third terminal 163 of three-terminal OTS 160 and the third terminal 173 of the terminal OTS 170 are tied to ground in the embodiment shown. Other embodiments may involve connecting the third terminal 163 of three-terminal OTS 160 and the third terminal 173 of the terminal OTS 170 to a negative voltage or current sink. Row control circuitry 140 may have individual connections to the control terminal 112 of three terminal OTS 110 and the control terminal 122 of the three terminal OTS 120 while column control circuitry 130 may have individual connections to the control terminal 162 of three-terminal OTS 160 and the control terminal 172 of three-terminal OTS 170.

Power supply circuitry 150 may have a connection 151 to a power source, a voltage regulator 153, a current limiter 155 and an output cut-off device 157. The output cut-off device 157 may be implemented as one or more metal oxide semiconductor field effect transistors (MOSFETs) as shown, or as any other device capable of stopping a current from flowing out of the power supply circuitry 150. The output cut-off device 157 may be controlled by the row control circuitry 140 using connection 141 as shown in circuit 100 circuit 100 or by other control circuitry.

Various implementations of reading the contents of the PCM cells may or may not use the current path through the three-terminal OTS devices, as reading the contents of the PCM cells may not require the high current levels that are required for programming the PCM cells and may, therefore, be implemented using typical integrated circuit MOSFETs or other circuitry.

In one or more embodiments, circuit 100 may include additional circuitry (not shown) to drive unselected word lines and/or bit lines with an inhibit voltage that may be about half-way between the voltage level of the word lines and the voltage level of the bit lines although the specific voltage level required may vary depending on the embodiment In most embodiments, the inhibit voltage may not need much current and therefore may be driven with standard, low-current MOSFET drivers or other circuitry well known to those of ordinary skill in the art. The MOSFETs for driving the inhibit voltage may be controlled by the row control circuitry 140, column control circuitry 130 or other control circuitry.

In various embodiments, circuit 100 may utilize architectures that may be different than the embodiment shown in FIG. 1A including for example a three-terminal OTS on only the word lines or only the bit lines, embodiments that may not organize the PCM cells into a two dimensional array, and circuit 100 may include various implementations of reading the contents of the PCM cells. Other embodiments of circuit 100 may utilize different configurations for the various functions described for the row control circuitry 140, column control circuitry 130 and/or power supply circuitry 150.

Figure 1B:
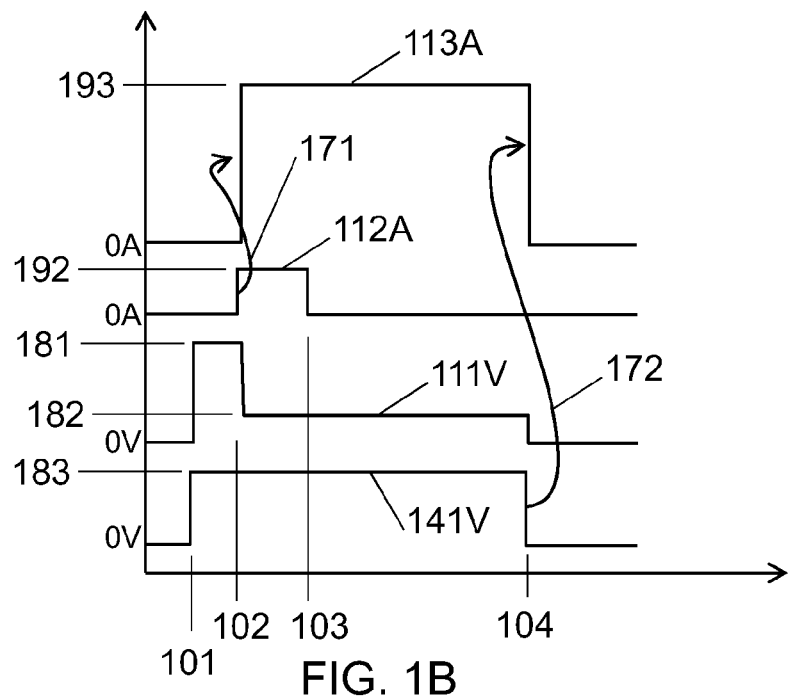
FIG. 1B shows several electrical waveforms from locations of the block diagram of FIG. 1A.

FIG. 1B shows several electrical waveforms from locations of the circuit 100 of FIG. 1A. Each waveform is labeled with the reference number of the node of the circuit 100. Waveform 141V shows the voltage waveform that may be sent from the row control circuitry 140 to the power supply circuitry 150 using connection 141 to control the output cut-off device 157. If the voltage of waveform 141V is set to a voltage level 183 at time 101, the output cut-off device 157 turns on, allowing the power supply circuitry 150 to provide power to the three-terminal OTS devices 110, 120. The value of voltage level 183 is dependent on the details of the embodiment but may be sufficient to enable the output cut-off device 157 to turn on. Waveform 111V shows the voltage waveform at the first terminal 111 of the three-terminal OTS 110. The same voltage waveform may also be attributed to the first terminal 121 of the three-terminal OTS 120 and the output of the power supply circuitry 150. After the output cut-off device 157 is enabled at time 101, the voltage waveform 111V may be driven to the voltage level 181 provided by the voltage regulator 153.

The PCMS cells 116, 117, 126, 127 of circuit 100 may connect the word lines and bit lines directly across the heater element so that there is minimal voltage drop across the PCMS cells. The voltage level 181 may be set to a value below the threshold voltage of a three-terminal OTS with no control current so that only a leakage current is flowing through three-terminal OTS devices, and therefore only minimal current is flowing through the heater element of the PCMS cells, so that essentially no heat is generated by the heater element as long as no control current is flowing into the three-terminal OTS devices.

At time 102, the row control circuitry 140 may inject a current, as shown by current waveform 112A, into the control terminal 112 of three-terminal OTS 110. The control current may have a current level 192 great enough to lower the voltage threshold of three-terminal OTS 110, but it may be a small current. A similar current may be injected into the control terminal 162 of three-terminal OTS 160 by the column control circuitry 130 at approximately the same time but no current is injected into the control terminal 122 of three-terminal OTS 120 or control terminal 172 of three-terminal OTS 170. The control currents change the threshold voltages of three-terminal OTS 110 and three-terminal OTS 160 to a lower voltage so that the voltage level 181 from the power supply circuitry exceeds the threshold voltages of the two three terminal OTSs 110, 160 and a programming current begins to flow from the power supply circuitry 150, through three-terminal OTS 110, the heater of PCMS cell 116, and three terminal OTS 160. The programming current is shown in voltage waveform 113A. Because three-terminal OTS 120 and three-terminal OTS 170 have no current flowing into their control terminals, both three-terminal OTSs 120, 170 maintain the higher threshold voltage and stay in their high resistive state so that no significant amount of current is flowing through the other three PCMS cells 117, 126, 127.

The control current shown in waveform 112A, injected into the control terminal 112 of three-terminal OTS 110 at time 102, along with the similar current into the control terminal 162 of the three-terminal OTS 160, may be considered a trigger 171 causing the programming current to begin to flow. Once the programming current is flowing, the current limiter 155 may limit the current flowing from the power supply circuitry 150 to a current level 193, thereby limiting the programming current to the PCMS cell 116 to a current level 193 set by the design and/or configuration of the current limiter 155. The voltage across the two three-terminal OTSs 110, 160 may fall to their saturation voltages once the three-terminal OTSs enter their conducting state, so the voltage at the output of the power supply 150 as shown in waveform 111V may fall at time 102 to a voltage level 182 that may be approximately the same as the sum of the saturation voltages of the two three-terminal OTSs 110, 160. After the three-terminal OTSs 110, 160 are in a conductive state, the row and or column control circuitry 140, 130 may shut off the control currents as shown in current waveform 112A at time 103. The programming current may continue to flow as long as the current level remains above the sustaining current of the three-terminal OTS devices. The programming current delivered to the PCMS cell 116 may cause the phase of the phase change material to change, thereby changing the memory state of the PCMS cell 116.

At a predetermined period of time after the programming current began, time 104, row control circuitry 140 may use the connection 141 to disable the output cut-off device 157. This is shown as waveform 141V going to 0V at time 104 causing the output of the power supply 150 (waveform 111V) to go to zero volts and causing the transition 172 of the programming current to drop to 0 A at time 104. The length of the predetermined period of time may depend on the current memory state of the PCMS cell 116, the new memory state being programmed into the PCMS cell 116, and/or other parameters. The length of the predetermined period of time may also depend at least in part on the details of the embodiment of the PCMS cell 116, including, but not limited to, the characteristics of the heater element, the characteristics of the phase change material, and the geometry of the design. Some embodiments may represent more than one bit of information in the memory state of single PCMS cell 116 requiring several different predetermined periods of time depending on the specific memory state transition involved, although the scope of the claimed subject matter is not limited in these respects.

In a three-terminal OTS device, there may be three separate threshold switches. There may be threshold switches between terminals one and two, between terminals one and three, and between terminals two and three. OTS devices in general, and therefore three-terminal OTS devices, may be non-polarized, so that current may flow in either direction between any two terminals. The threshold voltage at which the glassy material transforms from the resistive state to the conductive state may be different for each of the three separate threshold switches and may depend on the geometry of the three-terminal OTS and/or the glassy material used. The three separate threshold voltage values may be independently varied by altering the geometry of the three-terminal OTS, since threshold voltage is affected by the separation distance between two terminals. The threshold voltage between terminals one and two, $V_{T12}$, may be dependent on the distance between terminals one and two through the glassy material, $V_{T13}$ may be dependent on the distance between terminals one and three and $V_{T23}$ may be dependent on the distance between terminals two and three. The three-terminal OTS device may be thought of as a combination of three two-terminal OTS devices multiplexed at each terminal in a triangular configuration.

However, cross-interference may occur when more than one of the multiplexed two-terminal OTS devices is conducting. When the two-terminal OTS between terminals two and three is in the conducting state, then $V_{T12}$ and $V_{T13}$ may be reduced, depending on the proximity of conducting channel through the glassy material between terminals two and three to the conducting channels through the glass material between the other sets of terminals and the amount of current flowing through the conducting channel between terminals two and three. Therefore the values of, $V_{T12}$, $V_{T13}$, and $V_{T23}$ may depend at least in part on a status of the others.

Figure 2:
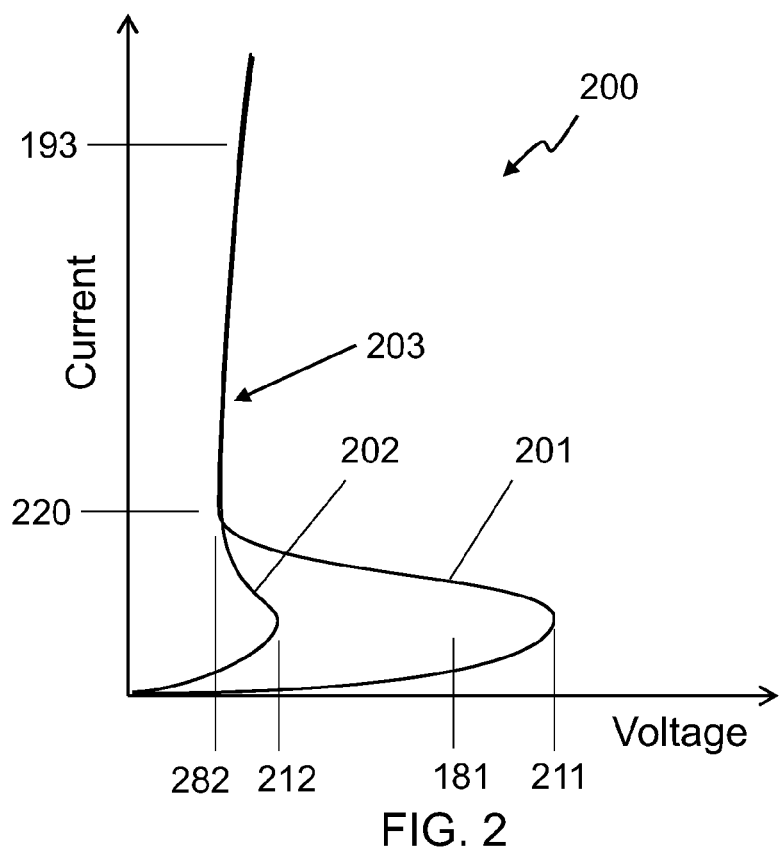
FIG. 2 shows a graph of current vs. voltage for two different operating modes of a three-terminal OTS useful for various embodiments.

FIG. 2 shows a graph 200 of current vs. voltage for two different operating modes of a three-terminal OTS useful for various embodiments. Curve 201 shows the relationship between voltage (the X-axis) and current (the Y-axis) across three-terminal OTS, or between terminals one and three, if no current is flowing into the control terminal. The three-terminal OTS may act as a typical two-terminal OTS with a $V_{T13}$ (or simply $V_T$) of voltage level 211. If starting from quiescent state wherein both voltage and current are at 0, as long as the voltage stays below $V_T$ (voltage level 211), very little current flows through the three-terminal OTS. But as soon as the voltage across the three-terminal OTS exceeds $V_T$, the current through the three-terminal OTS increases dramatically and the voltage across the three-terminal OTS actually falls to a saturation voltage at voltage level 282. As the current through the three-terminal OTS increases above current level 220, the voltage across the device may not rise a significant amount above the saturation voltage 282, even as the current increases into multiple milliamperes (mA), such as greater than about 2 mA, dependent on the embodiment. Once the current starts to flow through the three-terminal OTS, the voltage across the three-terminal OTS may remain close to the saturation voltage 282 unless the current drops below a sustaining current level, such as current level 220. Once the current falls below the sustaining current, the three-terminal OTS may re-enter the resistive state and effectively block the current until the voltage once again exceeds $V_T$.

Curve 202, however, shows the relationship between voltage (the X-axis) and current (the Y-axis) across three-terminal OTS (or between terminals one and three) if current is flowing into the control terminal to terminal three. The threshold voltage of the three terminal OTS, $V_T$, for curve 202 is reduced to voltage level 212 by injecting the control current into the control terminal of the three-terminal OTS. The amount of current flowing between the control terminal and terminal three may be highly dependent on the geometry of the device and the characteristics of the glassy material used, but in many embodiments, the current required may be quite small, in the microampere (μA) range for some embodiments and even in the nanoampere (nA) range or less for other embodiments. A current flowing into the control terminal may or may not affect the saturation voltage level 282 or the sustaining current level 220, depending on the embodiment.

The three-terminal OTS may have two different threshold voltages depending on whether a control current is flowing into the control terminal of the three-terminal OTS, $V_{Toff}$ (voltage level 211) if no current is flowing into the control terminal, and $V_{Ton}$ (voltage level 212) if current is flowing into the control terminal. If a power supply at a voltage level 181, between $V_{Ton}$ and $V_{Toff}$, that is current limited to a current level 193, is connected to the three terminal OTS, only a leakage current dependent on the resistance of the three-terminal OTS in the resistive state will flow through the three-terminal OTS. Then if a small current is injected into the control terminal of the three-terminal OTS, the threshold voltage may be reduced to $V_{Toff}$, which is below the voltage level 181 of the power supply, and current will flow through the three-terminal OTS, rising to the current limit 193 of the power supply with the voltage dropping to the saturation voltage 282 of the three-terminal OTS. This behavior of the three-terminal OTS may be responsible for the shape of voltage waveform 111V shown in FIG. 1B.

Figure 3:
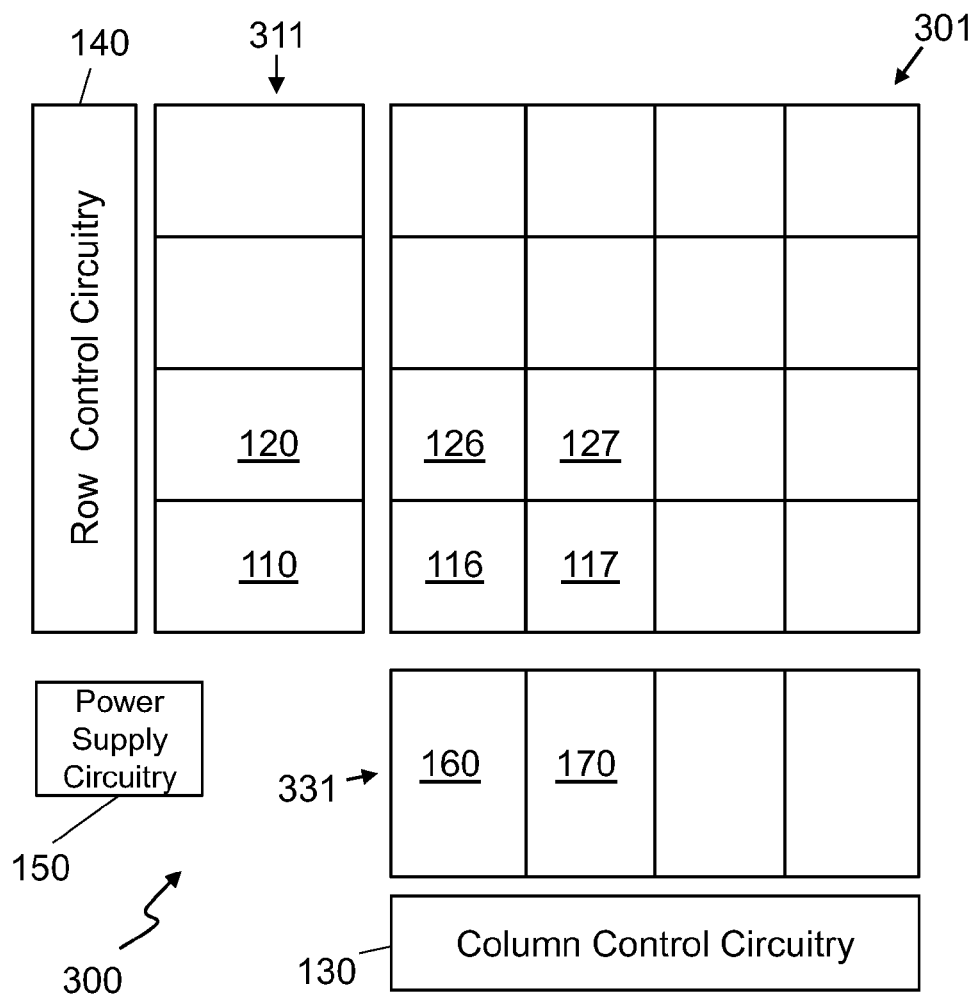
FIG. 3 shows a simplified floorplan for a phase change memory device using three-terminal OTS devices as row and column drivers consistent with some embodiments.

FIG. 3 shows a simplified floorplan 300 for a phase change memory device using three-terminal OTS devices as row drivers 311 and column drivers 331 consistent with some embodiments. The floorplan 300 shows a 4×4 array 301 of PCMS cells including PCMS cells 117, 116, 127, 126. The array 301 may have any number of PCMS cells and may or may not have the same number of rows as columns. Most embodiments may include millions or even billions, of PCMS cells to meet the memory requirements of modern computer systems. The array 301 may be built at regular pitch, with each cell placed a given distance (the pitch) from its nearest neighbor cells in both the X and Y directions. The pitch may be equal for X and Y or the array may have a different pitch in X than in Y. The pitch in either X or Y may be called the width of the PCMS cell. The pitch may be determined by the geometry of the PCM cells, the parameters of the process being used for manufacturing the device, or other design and/or physical parameters. Depending on the embodiment, the pitch could be nearly any distance consistent with an integrated circuit design. In some embodiments, the pitch may be several hundred nanometers (nm), while other embodiments may have a pitch of about 100 nm and future embodiments may have a pitch of 10 nm or less.

Row drivers 311 may each include a three-terminal OTS including three-terminal OTS 110 and three-terminal OTS 120. Row control circuitry 140 may be connected to the control terminal of each three-terminal OTS to be able to send current into the control terminal and therefore control the threshold voltage of each three-terminal OTS. Power supply circuitry 150 may provide power to the row drivers 311 and may also be controlled by the row control circuitry. Column drivers 331 also may each include a three-terminal OTS including three-terminal OTS 160 and three-terminal OTS 170 in a similar configuration as the row drivers 311. Column control circuitry 130 may control the control terminal of the three-terminal OTS devices of the column drivers 331.

PCMS cells 117, 116, 127, 126 may require a high peak current for programming. When PCMS cells 117, 116, 127, 126 are incorporated into an array 301, the drivers 311, 331 for providing the high peak current may be included around the edges of the array 301. In the inventors' experience, some existing memory designs utilizing PCM technology use current drivers based on MOSFETs. To sustain the current required for programming a PCM cell, the MOSFET may be very large, and then cannot be built at the same pitch as the memory array, and may even need to be more than twice the size of the pitch of the memory array. If the driver is larger than the pitch of the memory array 310 (such as drivers built using MOSFETs) more complicated routing or a relaxed pitch for the array may be used, both of which are inefficient. Three-terminal OTS devices may be able to provide the high current density needed to build the three-terminal OTS used in the drivers 311, 331 with a width equal to the pitch of the memory array 301 (or same width as the PCM cell) although in some embodiments, the OTS devices may be built with a width even less than the pitch of the array 301 and in other embodiments, the OTS devices may be built with a width slightly larger than the pitch of the memory array 301, up to 10% larger in some embodiments. In other embodiments three terminal OTS devices may be provided on opposite sides of the array, for example with a three-terminal OTS device on one end of a pair or fows driving the even row and a three-terminal OTS device on the opposite end of the rows driving the odd row. Building the current drivers at a pitch equal to or less than the pitch of the memory array 301, enables efficient use of the integrated circuit die area and also reduces routing complexity. The pitch may be matched by either building three-terminal OTS drivers with the same pitch as the PCM array on one side of a row/column or by building the three-terminal OTS drivers sized at twice the pitch of the PCM array and putting the three-terminal OTS drivers on both sides of the row/column.

Figure 4:
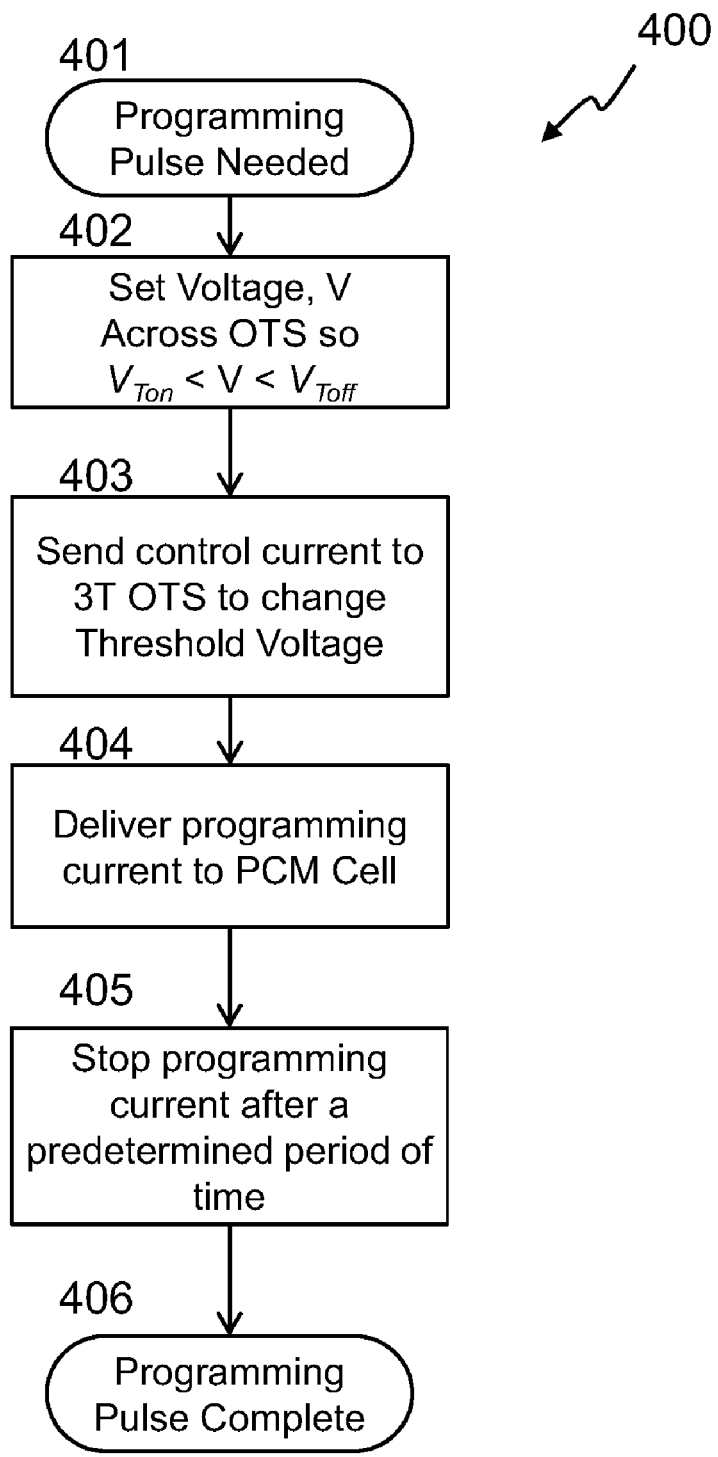
FIG. 4 is a flow chart for an embodiment of a method of using a three-terminal OTS device to drive current to a PCM cell.

FIG. 4 is a flow chart 400 for an embodiment of a method of using a three-terminal OTS device to drive current to a PCM cell. After determining that a programming pulse is needed at block 401, a voltage is set at block 402 so that the voltage across the three-terminal OTS is less than $V_{Toff}$ of the three-terminal OTS and greater than $V_{Ton}$ of the three-terminal OTS. The exact voltage needed is dependent on the embodiment but may depend on the characteristics of the one or more three-terminal OTS devices as well as any other elements that the programming current may flow through.

To start the flow of programming current, a control current is sent to the control terminal of the three-terminal OTS at block 403 to change the threshold voltage of the three-terminal OTS from $V_{Toff}$ to $V_{Ton}$. This causes a programming current to flow through the PCM cell and through at least one three-terminal OTS at block 404. After a predetermined period of time, the programming current may be stopped at block 405 and the programming pulse may be complete at 406. The memory state of the PCM cell may be changed soon after the programming pulse has ended.

Figure 5:
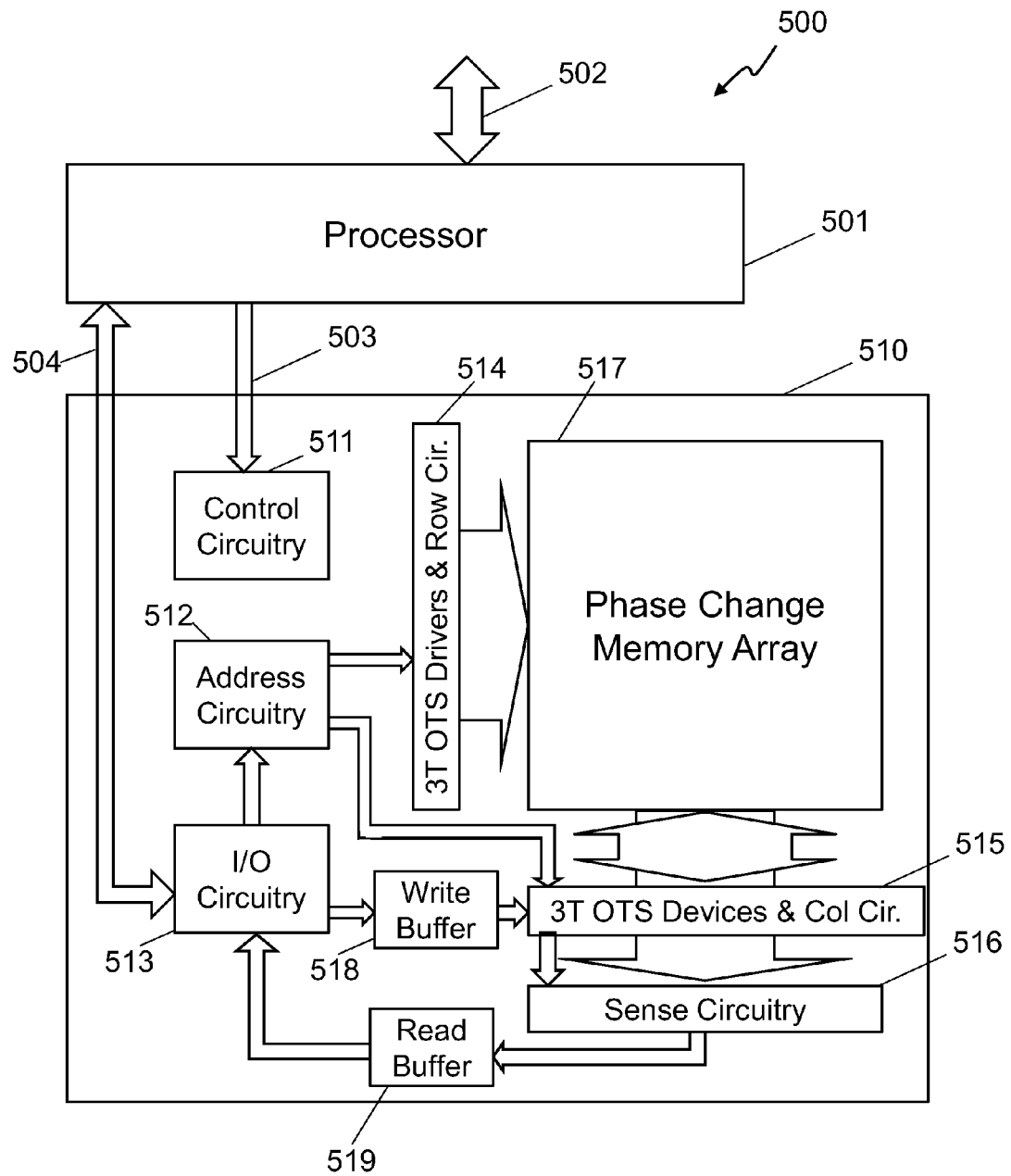
FIG. 5 shows a block diagram of an embodiment of a computing or storage system utilizing a memory device consistent with the present subject matter.

FIG. 5 shows a block diagram of an embodiment of a computing or storage system 500 comprising a processor 501 coupled to a memory device 510 consistent with the present subject matter, with control lines 503 and data lines 504. In some embodiments data and control may utilize the same lines. The processor 501 may be an external microprocessor, microcontroller, or some other type of external controlling circuitry. In some embodiments, the processor 501 may be integrated in the same package or even on the same die as the memory device 510. In some embodiments, the processor 501 may be integrated with the control circuitry 511, allowing some of the same circuitry to be used for both functions. The processor 501 may have external memory, such as RAM and ROM, used for program storage and intermediate data or it may have internal RAM or ROM. In some embodiments, the processor may use the memory device 510 for program or data storage. A program running on the processor 501 may implement many different functions including, but not limited to, an operating system, a file system, bad cell or block mapping, and error management The block diagram of computing or storage system 500 has been simplified to focus on features of the memory that are helpful in understanding this disclosure.

In some embodiments an external connection 502 is provided. The external connection 502 is coupled to the processor 501 and allows the processor 501 to communicate to external devices. In the case of a storage system, the external connection 502 may be used to provide an external device with non-volatile storage. The external connection 502 may be used to connect to a computer or other intelligent device such as a cell phone or digital camera, or a peripheral device such as a printer, display, keyboard and/or mouse, using a standard or proprietary communication protocol. Examples of computer communication protocols that the external connection may be compatible with include, but are not limited to, any version of the following protocols: Universal Serial Bus (USB), High Definition Multimedia Interface (HDMI), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCIe).

The memory device 510 includes an array 517 of phase change memory (PCM) cells. Each cell in the PCM array 517 includes a portion of phase change material and may optionally include a heater element and/or an access device such as a diode, metal oxide semiconductor (MOS) transistor, or ovonic threshold switch (OTS) device. The PCM array 517 may be arranged in banks of word line rows and bit line columns.

Address buffer circuitry 512 is provided to latch address signals provided through the I/O circuitry 513. Address signals are received, decoded by control circuitry which may control three-terminal OTS devices 514 to drive word lines to the PCM array 517, at least during programming of the cells. Some embodiments may also utilize three-terminal OTS devices 515 connected to the bit lines. It may be appreciated by those skilled in the art, with the benefit of the present description, that the number of address input connections depends on the density and architecture of the PCM array 517. That is, the number of addresses increases with both increased memory cell counts and increased bank and block counts.

The memory device 510 reads data in the PCM array 517 by sensing changes in threshold voltage or resistance of addressed PCM cells using sense circuitry 516. The sense circuitry 516, in one embodiment, is coupled to read and latch a row of data from the PCM array 517. Write buffers 518 may be used in some embodiments to accumulate data until a write can be performed and read buffers 519 may hold data read from the PCM array 517 until it can be set out through the data lines 504. The I/O circuitry 513 routes the data through the I/O pins of the memory device 510.

Memory control circuitry 511 decodes commands provided on control lines 503 from the processor 501. These commands are used to control the operations on the PCM array 517, including data read and data write (program) operations. The memory controller circuitry 511 may be a state machine, a sequencer, a processor, or some other type of controller to generate the voltage waveforms necessary to control the PCM array 517. The control circuitry 511 communicates with the other blocks in the memory device but those connections are not shown as they would overly complicate the block diagram 500 and one skilled in the art can understand that the control circuitry 511 has numerous interconnections with the other blocks in order to control their functions.

The system illustrated in FIG. 5 has been simplified to facilitate a basic understanding of the features of the memory. Many different embodiments are possible including using a single processor 502 to control a plurality of memory devices 510 to provide for more storage space. Additional functions, such as a video graphics controller driving a monitor, and other devices for human oriented I/O may be included in some embodiments.

Various embodiments of the method described in flow chart 400 and/or block diagrams 100, 500 may be implemented in dedicated hardware circuits, hardware state machines, firmware, microcode, and/or software running on a processor. In some embodiments, aspects of the method described in flow chart 400 may be embodied in a computer program product embedded on a non-transitory computer readable storage medium such as a hard disk drive, optical disk, read-only memory (ROM) device or read/write random access memory (RAM) device or other computer readable storage medium.

Figure 6:
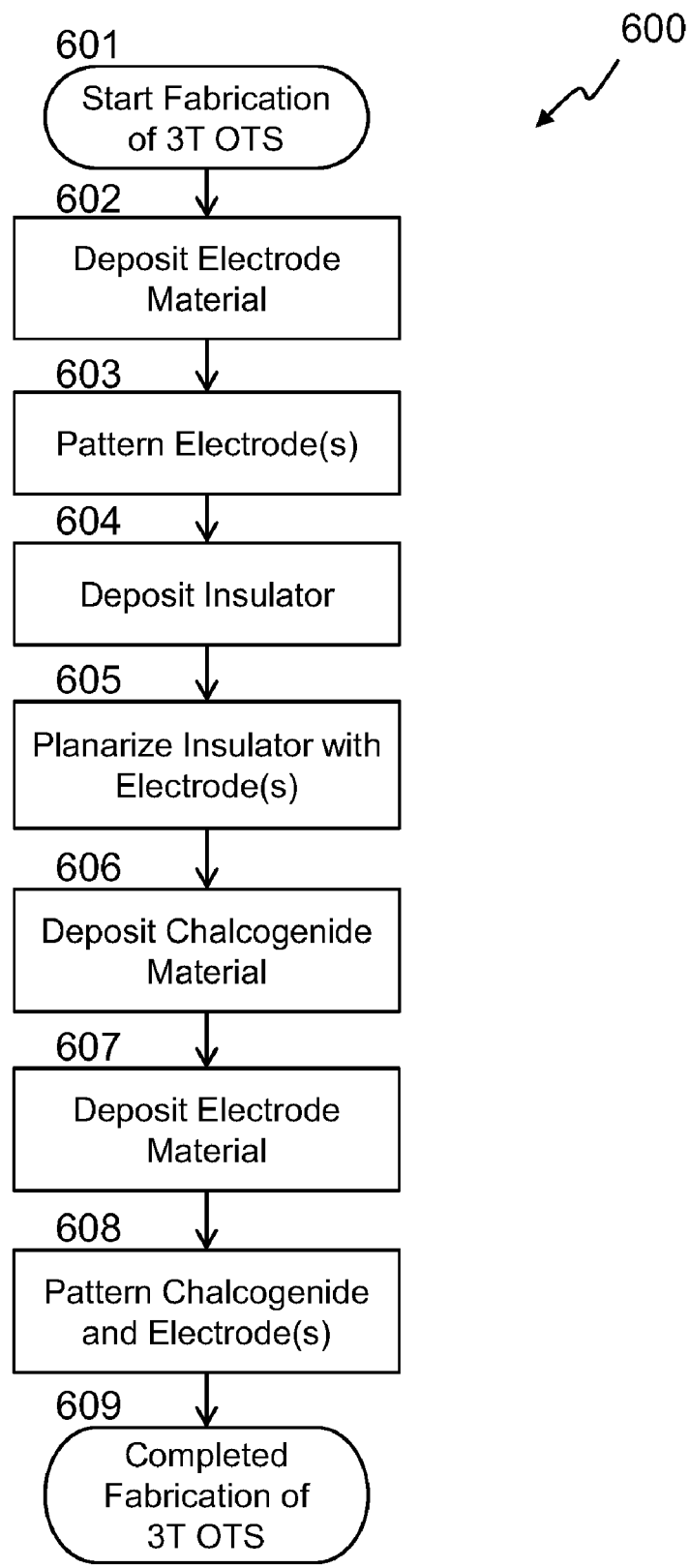
FIG. 6 shows a flow chart for an embodiment of manufacturing three-terminal OTS devices.
Figure 7A:
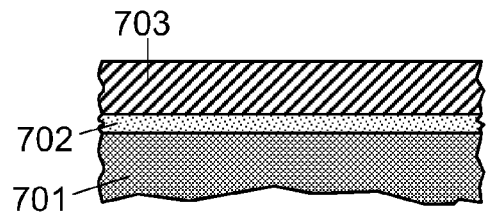
FIG. 7A-7F show cross-sectional views of various stages of manufacture of an embodiment of the three-terminal OTS.

FIG. 6 shows a flow chart 600 for an embodiment of manufacturing three-terminal OTS devices; FIG. 7A-7F show cross-sectional views of various stages of manufacture of an embodiment of the three-terminal OTS; FIGS. 8A and 8B show alternative embodiments of the three-terminal OTS; and FIG. 9A-9F show cross-sectional views of various stages of manufacture of another alternative embodiment of the three-terminal OTS. FIGS. 6-9F are discussed together below.

Flow chart 600 begins with the start of fabrication of an integrated circuit device that may incorporate three-terminal OTS at block 601. A substrate 701, which may be a silicon wafer, may be coated with an insulating layer 702, which may be a silicon oxide layer or other insulating material. A layer of electrode material 703 may be deposited on top of the insulating layer 702 at block 602. The layer of electrode material 703 may be made of aluminum (Al), copper (Cu) or other highly conductive material. The layer of electrode material 703 may be deposited by any method known in the art including, but not limited to, vapor deposition, electroplating, sputtering or other method of depositing a layer of conductive material onto a substrate.

At block 603, the electrodes 711 and 713, 813, or 911 and 913, may be patterned from the layer of electrode material 703. A layer of resist material may be applied to the electrode material 703. Optical lithography, x-ray lithography, e-beam lithography, or other methodologies known in the art may then be used to create the pattern for the electrodes 711 and 713, 813, or 911 and 913 which may or may not use a mask for generating the patterns. The unwanted portions of the electrode material 703, for example portions that do not appear in the end device, may then be removed using an etching process then the remaining resist material may need to be removed.

Figure 7B:
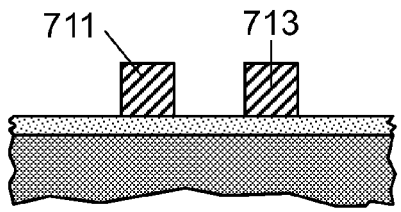
Figure 8A:
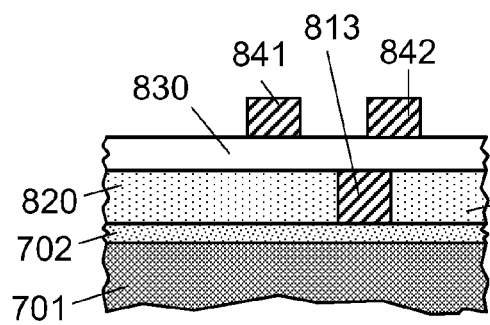
FIGS. 8A and 8B show alternative embodiments of the three-terminal OTS.
Figure 8B:
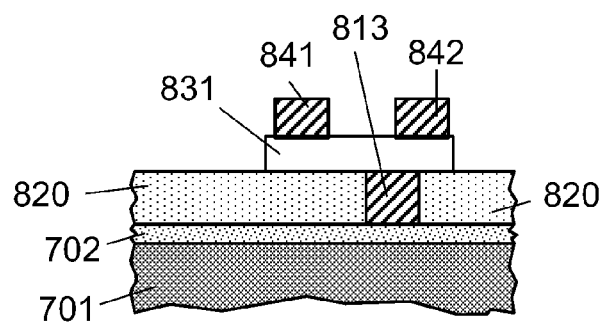
Figure 9A:
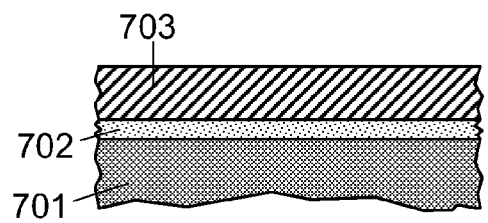
FIG. 9A-9F show cross-sectional views of various stages of manufacture of another alternative embodiment of the three-terminal OTS.
Figure 9B:
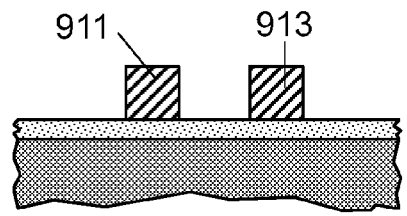

Two electrodes (or terminals) 711 and 713 or 911 and 913 may be formed from the first layer of electrode material 703 in some embodiments, as shown in FIG. 7B and FIG. 9B. In other embodiments, such as those shown in FIGS. 8A and 8B, only one electrode (or terminal) 813 may be formed from the first layer of electrode material 703. Once the electrodes are formed, a layer of insulating material 720, 820 or 920, which may be silicon oxide or other insulting material, may be deposited on, between, and around the electrodes 711 and 713, 813, or 911 and 913 at block 604.

The insulating layer 720,820 or 920 may need to be removed from the top of the electrodes 711 and 713, 813, or 911 and 913 at block 605 to expose an electrical contact area for the electrodes. In the embodiment shown in FIG. 7C (as well as 8A & 8B), the surface is planarized to provide a flat surface with the tops of the electrodes 711 and 713, or 813 and the insulting material 720 or 820 to be at nearly equal levels. The planarization may be accomplished using a chemical, mechanical, or a chemical/mechanical process. In the embodiment shown in FIG. 9C, the insulting material 920 may be removed to a level below the tops of the electrodes 911 and 913 to provide a larger electrical contact area to the electrodes. In some embodiments, the surface may be planarized first using a mechanical or chemical/mechanical process, and then more of the insulating layer chemically etched away. In other embodiments, the entire process may be accomplished using chemical processes.

A layer of glassy material 730, 830, or 930 may be deposited on top of the insulating layer 730, 830 or 930 and electrodes 711 and 713, 813, or 911 and 913 at block 606. The glassy material 730, 830 or 930 may have a high resistance state and a conductive state and may be a chalcogenide material. The glassy material 730, 830 or 930 may be in electrical contact with the electrodes 711 and 713, 813, or 911 and 913. A second layer of electrode material 740 or 940 may be deposited on top of, and in electrical contact with, the glassy material 730, 830 or 930 at block 607. The second layer of electrode material 740 or 940 may be the same material as that used in the first layer of electrode material 703 or the second layer of electrode material may be a different material than the first layer of electrode material in some embodiments.

The layer of glassy material 730, 830, 930 and the second layer of electrode material 740, 940 may be patterned in block 608. In some embodiments, the layer of glassy material may not be patterned, as shown in FIG. 8A, using the insulating properties of the glassy material to isolate adjacent three-terminal OTSs. In some embodiments, the glassy material 730, 830, 930 may be patterned before the second layer of electrode material 740, 940 is deposited. In other embodiments, the combination of the second layer of electrode material 740, 940 and glassy material 730, 830, 940 may be patterned together providing matching geometries for the remaining glassy material 731, 931 and electrode (or terminal) 741, 941 created from the second layer of glassy material 740, 940. In some embodiments, an additional patterning process may be performed to make the top electrodes (or terminals) 742, 841 and 842 or 942 smaller than the remaining glassy material 731, 831, 931. This may be done to provide appropriate geometry for the desired electrical characteristics of the three-terminal OTS such as the desired threshold voltages or desired control current level. In some embodiments, such as those shown in FIGS. 7E, 7F, 9E and 9F, a single terminal 741, 742, 941, or 942 may be created from the second layer of electrode material 740, 940. In other embodiments, two terminals 841 and 842 may be created from the second layer of electrode material.

Once the desired terminals (or electrodes) 741, 742, 841, 842, 941 and/or 942 have been created from the second layer of electrode material 740, 940, the three-terminal OTS may be completed at block 609. The exact geometries used for the three-terminal OTS, including layer thicknesses 703, 730, 830, 930, 740, 940, the sizes of the electrodes 711, 713, 741, 742, 813, 841, 842, 911, 913, 941 and/or 942 and the size of the remaining glassy material 731, 831, 931, may be highly dependent on the materials (including the electrode material, the insulting material, and the glassy material) and processes used (including the lithography processes, the deposition processes and other processes). The geometries may also be dependent on the desired electrical properties of the three-terminal OTS.

The method shown in flow chart 600 may be a subset of processing steps for building a phase change memory device. The block shown may also be used for building PCM cells. For example block 606 may also deposit chalcogenide material used in the PCM cell and blocks 607 and 608 may also be used for creating an electrode on the top of the PCM cell.

Figure 7C:
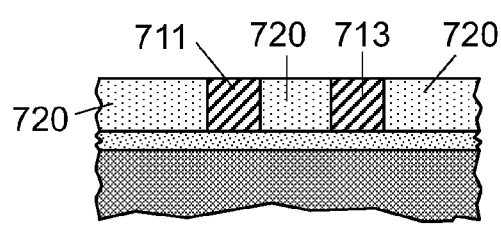
Figure 7D:
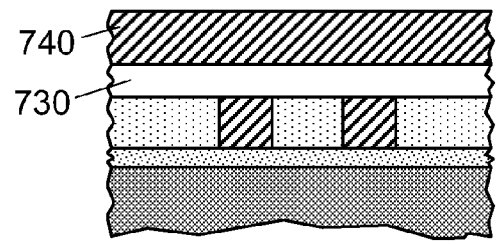
Figure 7E:
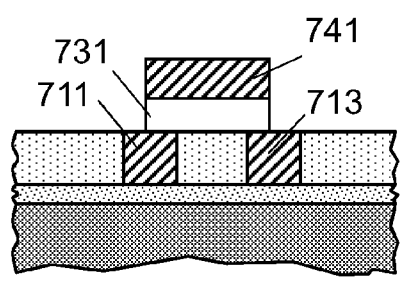
Figure 7F:
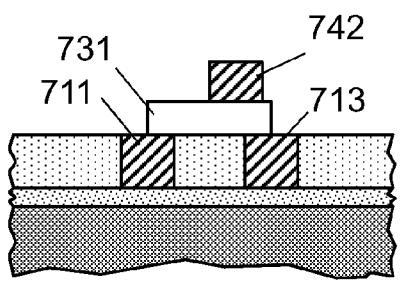

FIG. 7A-7F show cross sectional views of various stages of manufacture of a three-terminal OTS. FIG. 7A shows a cross sectional view of the partially manufactured three-terminal OTS after block 602. FIG. 7B shows a cross sectional view of the partially manufactured three-terminal OTS after block 603. FIG. 7C shows a cross sectional view of the partially manufactured three-terminal OTS after block 605. FIG. 7D shows a cross sectional view of the partially manufactured three-terminal OTS after block 607. FIG. 7E shows a cross sectional view of one embodiment of a completed three-terminal OTS after block 608. FIG. 7F shows a cross sectional view of a completed three-terminal OTS after block 608 but with a first patterning of the chalcogenide and electrode materials together and an additional patterning of the electrode material to form a second terminal 742 that is smaller than the chalcogenide material 731 of the three-terminal OTS.

FIG. 8A shows an alternative embodiment of the three-terminal OTS after block 608 but where the chalcogenide material was not patterned and where the first layer of electrode material is used to form only the third terminal 813 and the second layer of electrode material is used to form the first terminal 841 and second terminal 842 of the three-terminal OTS. FIG. 8B shows an alternative embodiment of the three-terminal OTS after block 608 where the chalcogenide and electrode material were patterned together and then a separate patterning was performed on the second layer of electrode material. In FIG. 8B the first layer of electrode material is used to form only the third terminal 813 and the second layer of electrode material is used to form the first terminal 841 and second terminal 842 of the three-terminal OTS.

Figure 9C:
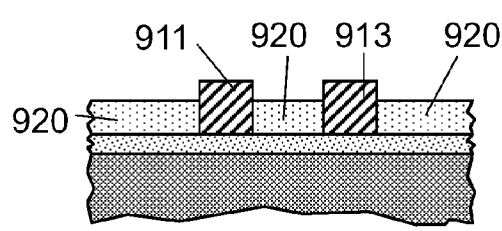
Figure 9D:
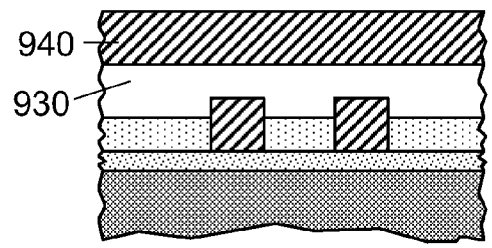
Figure 9E:
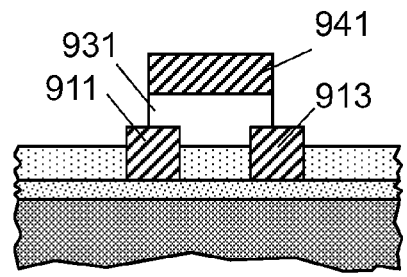
Figure 9F:
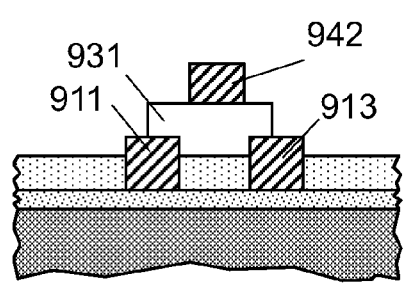

FIG. 9A-9F show cross sectional views of various stages of manufacture of a three-terminal OTS. FIG. 9A shows a cross sectional view of the partially manufactured three-terminal OTS after block 602. FIG. 9B shows a cross sectional view of the partially manufactured three-terminal OTS after block 603. FIG. 9C shows a cross sectional view of the partially manufactured three-terminal OTS after block 605 but instead of planarizing the surface, additional insulating material has been removed so that the first terminal 911 and third terminal 913 rise above the remaining later of insulating material 920. FIG. 9D shows a cross sectional view of the partially manufactured three-terminal OTS after block 607. FIG. 9E shows a cross sectional view of one embodiment of a completed three-terminal OTS after block 608. FIG. 9F shows a cross sectional view of a completed three-terminal OTS after block 608 but with a first patterning of the chalcogenide and electrode materials together and an additional patterning of the electrode material to form a second terminal 942 that is smaller than the chalcogenide material 931 of the three-terminal OTS.

It is appreciated that the claimed subject matter has been explained with reference to exemplary embodiments, and that the claimed subject matter is not limited to the specific details given above. References in the specification made to other embodiments fall into the scope of the present claimed subject matter.

Any reference to device may include a component, circuit, module, or any such mechanism in which the device can achieve the purpose or description as indicated by the modifier preceding the device. However, the component, circuit, module, or any such mechanism is not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element. As used herein, the term "coupled" includes direct and indirect connections. Moreover, where first and second devices are coupled, intervening devices including active devices may be located there between.

Those skilled in the art having the benefit of this disclosure will appreciate that many other variations from the foregoing description and drawings may be made within the scope of the present claimed subject matter. Indeed, the claimed subject matter is not limited to the details described above, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method of delivering current to a phase change memory cell, the method comprising:
   setting a voltage level across a three-terminal ovonic threshold switch (OTS) that is less than a first voltage and greater than a second voltage; and
   delivering a programming current to a phase change memory cell by sending a control current into a control terminal of the three-terminal OTS to change a threshold voltage of the three-terminal OTS from the first voltage to the second voltage;
   wherein said programming current flows through the three-terminal OTS and said programming current is larger than said control current.

2. The method of claim 1, further comprising:
   stopping said programming current after a predetermined period of time.

3. The method of claim 2, wherein said programming current changes said phase change memory cell changes to a new memory state.

4. A memory device comprising:
   a three-terminal ovonic threshold switch (OTS);
   power supply circuitry electrically coupled to the three-terminal OTS;
   control circuitry electrically coupled to the control terminal of the three-terminal OTS; and
   a phase change memory cell electrically coupled to the three-terminal OTS;
   wherein the power supply circuitry is configured to set a voltage level across the three-terminal OTS that is less than a first voltage and greater than a second voltage;
   the control circuitry is configured to cause a programming current to flow through the three-terminal OTS and the phase change memory cell by injecting a control current into the control terminal of the three-terminal OTS to change a threshold voltage of the three-terminal OTS from the first voltage to the second voltage, wherein the programming current is larger than the control current; and
   the phase change memory cell is configured to cause the programming current to change a memory state of the phase change memory cell.

5. The memory device of claim 4, wherein a width of the three-terminal OTS is no greater than about 110% of a width of the phase change memory cell.

6. The memory device of claim 4, wherein a width of the three-terminal OTS is between about 110% and about 210% of a width of the phase change memory cell.

7. The memory device of claim 4, wherein the power supply circuitry is configured to limit said programming current to a predetermined current level.

8. The memory device of claim 4, wherein said memory state of the phase change memory cell represents more than one bit of information.

9. The memory device of claim 4, wherein the control circuitry is further configured to control the power supply circuitry to stop said programming current after said programming current has flowed for a predetermined period of time.

10. A system comprising:
    a processor and a memory device communicatively coupled to the processor, the processor being configured to read and write data to the memory device, the memory device comprising:
    a three-terminal ovonic threshold switch (OTS);
    power supply circuitry electrically coupled to the three-terminal OTS;
    control circuitry electrically coupled to the control terminal of the three-terminal OTS; and
    a phase change memory cell electrically coupled to the three-terminal OTS;
    wherein the power supply circuitry is configured to set a voltage level across the three-terminal OTS that is less than a first voltage and greater than a second voltage;
    the control circuitry is configured to cause a programming current to flow through the three-terminal OTS and the phase change memory cell by injecting a control current into the control terminal of the three-terminal OTS to change a threshold voltage of the three-terminal OTS from the first voltage to the second voltage, wherein the programming current is larger than the control current; and the phase change memory cell is configured to cause the programming current to change a memory state of the phase change memory cell.

11. The system of claim 10, further comprising an external connection, the external connection communicatively coupled to the processor; wherein the processor is configured to receive a write command and write data through the external connection and store the write data in the memory device; and the processor is configured to receive a read command from the external connection, retrieve read data from the memory device, and send the read data through the external connection.

12. The system of claim 11, wherein the external connection provides for a computer communication protocol.

* * * * *